United States Patent
Tong et al.

(10) Patent No.: US 8,471,721 B2
(45) Date of Patent: Jun. 25, 2013

(54) SERVER RACK HAVING PAYLOAD WEIGHING FUNCTION

(75) Inventors: Song-Lin Tong, Shenzhen (CN); Guang-Dong Yuan, Shenzhen (CN); Hai-Qing Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 195 days.

(21) Appl. No.: 13/085,439

(22) Filed: Apr. 12, 2011

(65) Prior Publication Data

US 2012/0182151 A1    Jul. 19, 2012

(30) Foreign Application Priority Data

Jan. 19, 2011    (CN) .......................... 2011 1 0021433

(51) Int. Cl.
    *G08B 21/00*    (2006.01)
(52) U.S. Cl.
    USPC ........ 340/666; 73/1.57; 73/23.32; 177/25.13; 257/415; 327/307; 327/427; 327/554; 330/98; 340/440; 340/573.1; 340/870.14; 340/572.3; 341/172; 361/211; 600/300; 705/2; 709/224; 713/310; 713/340
(58) Field of Classification Search
    USPC ................... 340/440, 541, 572.3, 573.1, 575, 340/666, 870.14; 327/427, 554, 307; 713/310, 713/340; 73/1.57, 23.32; 177/25.13; 257/415; 330/98; 341/172; 600/300; 705/2; 709/224
    See application file for complete search history.

(56) References Cited

U.S. PATENT DOCUMENTS

| | | | | | |
|---|---|---|---|---|---|
| 3,559,204 | A | * | 1/1971 | Dashper | 340/666 |
| 5,703,516 | A | * | 12/1997 | Takashima | 327/307 |
| 5,844,474 | A | * | 12/1998 | Saling et al. | 340/440 |
| 6,545,613 | B1 | * | 4/2003 | Hornback | 340/870.14 |
| 7,969,315 | B1 | * | 6/2011 | Ross et al. | 340/573.1 |
| 8,138,922 | B2 | * | 3/2012 | Lindsay et al. | 340/572.3 |
| 8,203,454 | B2 | * | 6/2012 | Knight et al. | 340/573.1 |
| 2001/0056229 | A1 | * | 12/2001 | Cosentino et al. | 600/300 |
| 2004/0003947 | A1 | * | 1/2004 | Kesselman et al. | 177/25.13 |
| 2006/0091933 | A1 | * | 5/2006 | Makino et al. | 327/427 |
| 2006/0168462 | A1 | * | 7/2006 | Leech et al. | 713/310 |
| 2006/0232430 | A1 | * | 10/2006 | Takaoka et al. | 340/575 |
| 2009/0027196 | A1 | * | 1/2009 | Schoettle | 340/541 |
| 2009/0095052 | A1 | * | 4/2009 | Inoue et al. | 73/23.32 |
| 2010/0025783 | A1 | * | 2/2010 | Katsumata et al. | 257/415 |
| 2010/0237936 | A1 | * | 9/2010 | Takeda | 330/98 |
| 2011/0019330 | A1 | * | 1/2011 | Hunt et al. | 361/211 |
| 2011/0023577 | A1 | * | 2/2011 | Dawson | 73/1.57 |
| 2011/0221518 | A1 | * | 9/2011 | Romero | 327/554 |

(Continued)

*Primary Examiner* — Daniel Wu
*Assistant Examiner* — Israel Daramola
(74) *Attorney, Agent, or Firm* — Altis Law Group, Inc.

(57) ABSTRACT

A server rack includes a main body, an electronic scale, and an alarm. The main body is used for receiving a number of servers. The electronic scale includes a pressure sensor and a microcontroller. The main body presses on the pressure sensor so that the pressure sensor can measure the pressure from the main body to obtain a pressure signal. The microcontroller analyzes the pressure signal to calculating the total weight of the main body and the servers. The alarm stores a predetermined weight threshold, which is the total weight of the main body and the maximum servers that the main body can bear. The alarm also compares the measured total weight with the predetermined weight threshold. When the measured total weight is larger than the predetermined weight threshold, the alarm alarms.

11 Claims, 5 Drawing Sheets

U.S. PATENT DOCUMENTS

2011/0234441 A1* 9/2011 Makihara et al. ............. 341/172
2012/0041771 A1* 2/2012 Cosentino et al. ................ 705/2
2012/0137158 A1* 5/2012 Nelluri et al. .................. 713/340
2012/0246304 A1* 9/2012 Mase ............................ 709/224

* cited by examiner

SERVER RACK HAVING PAYLOAD WEIGHING FUNCTION

BACKGROUND

1. Technical Field

The present disclosure relates to server racks, and particularly, to a server rack having a payload weighing function.

2. Description of Related Art

Server racks are used for accommodating a number of blade servers. But the load-carrying capacity of a server rack is limited. When the weight of the blade servers exceeds the load-carrying capacity of the server rack, the server rack is at risk of being damaged.

Therefore, it is desirable to provide a server rack, which can overcome the above-mentioned limitations.

BRIEF DESCRIPTION OF THE DRAWINGS

Many aspects of the disclosures should be better understood with reference to the following drawings. The components in the drawings are not necessarily drawn to scale, the emphasis instead being placed upon clearly illustrating the principles of the present disclosure.

DETAILED DESCRIPTION

Figure 1:
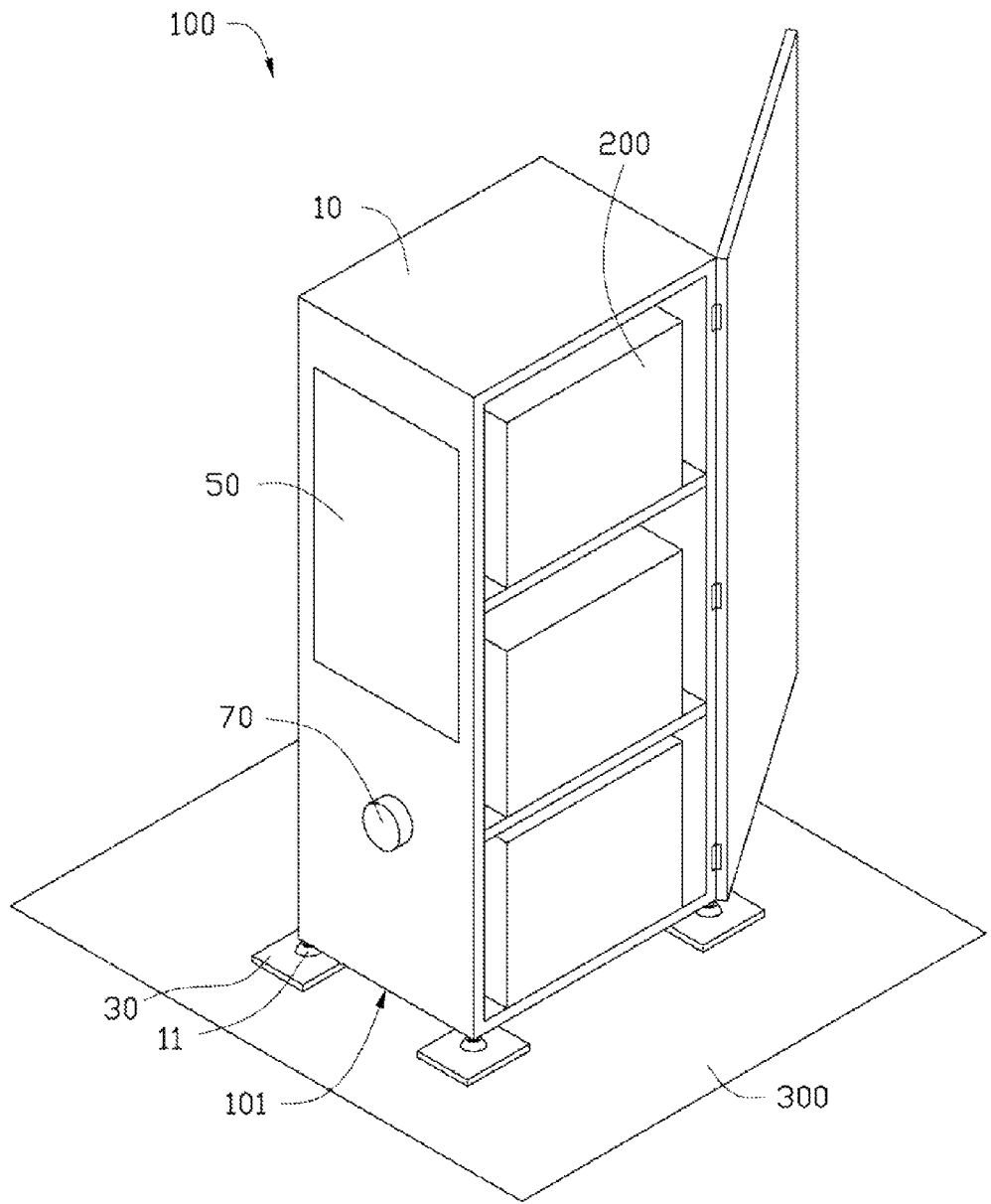
FIG. 1 is a schematic view of a server rack, according to an exemplary embodiment.
Figure 2:
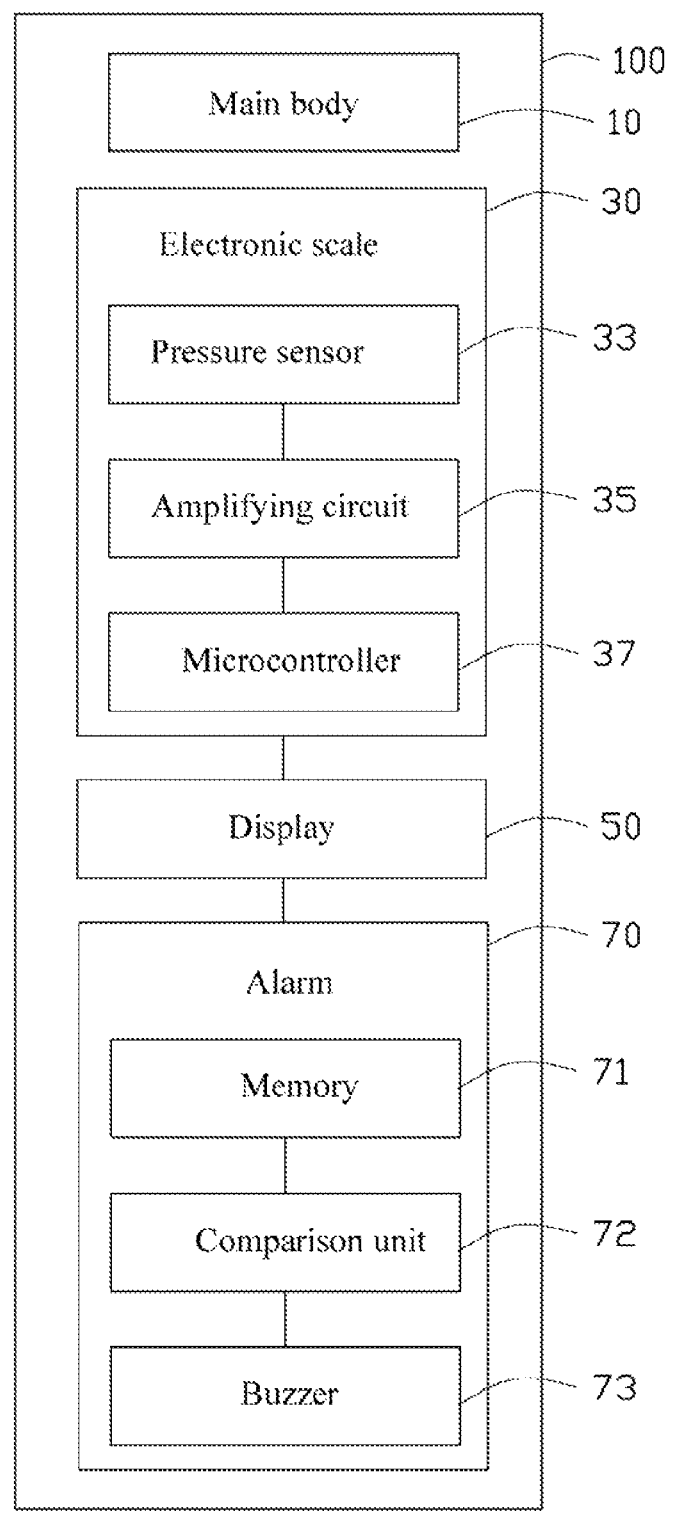
FIG. 2 is one embodiment of a functional block diagram of the server rack of FIG. 1.

Referring to FIG. 1 and FIG. 2, a server rack 100 is used for accommodating a number of blade servers 200 and includes a main body 10, an electronic scale 30, a display 50, and an alarm 70. The display 50 and the alarm 70 are electrically connected to the electronic scale 30.

The main body 10 is hollow and cuboid-shaped, and used for receiving the blade servers 200 therein. The main body 10 is positioned on a loading surface 300, and includes a bottom surface 101 facing the loading surface 300. Four supporting feet 11 are respectively fixed on four corners of the bottom surface 101, and used for supporting the main body 10. In one embodiment, the supporting feet 11 can be made of light metal.

The electronic scale 30 includes four pressure sensors 33, four amplifying circuits 35, and a microcontroller 37.

Figure 3:
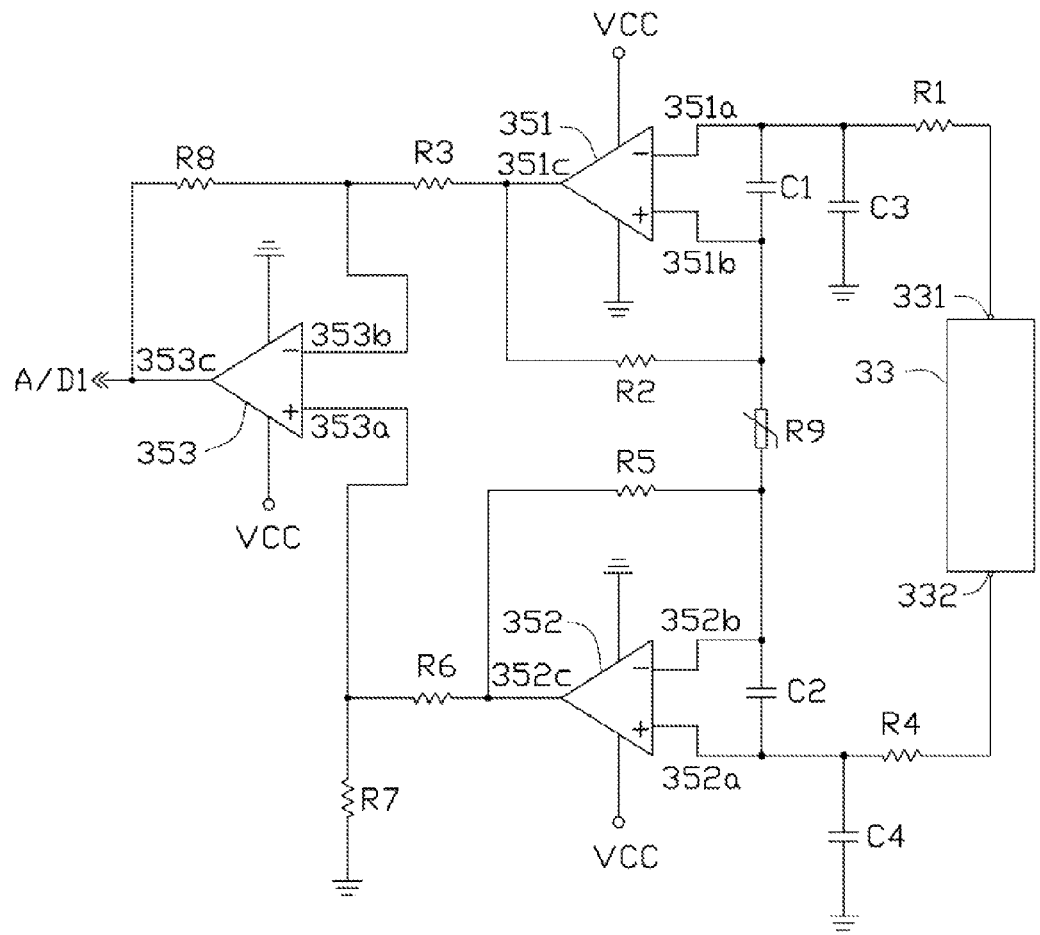
FIG. 3 is one embodiment of a schematic view of an amplifying circuit of the server rack of FIG. 1.

Referring to FIG. 3, each pressure sensor 33 is positioned under a corresponding one of the supporting feet 11 to sense any loads supported by the feet 11, and includes a first signal terminal 331 and a second signal terminal 332 used for outputting pressure signals.

Referring to FIGS. 2-3, each amplifying circuit 35 is used for amplifying the pressure signal of the corresponding pressure sensor 33, and includes a first operational amplifier 351, a second operational amplifier 352, a third operational amplifier 353, a first resistor R1, a second resistor R2, a third resistor R3, a fourth resistor R4, a fifth resistor R5, a sixth resistor R6, a seventh resistor R7, an eighth resistor R8, a first capacitor C1, a second capacitor C2, a third capacitor C3, and a fourth capacitor C4.

The first operational amplifier 351 includes a first negative input terminal 351a, a first positive input terminal 351b, and a first output terminal 351c. The second operational amplifier 352 includes a second positive input terminal 352a, a second negative input terminal 352b, and a second output terminal 352c. The third operational amplifier 353 includes a third positive input terminal 353a, a third negative input terminal 353b, and a third output terminal 353c.

The first negative input terminal 351a is connected to the first signal terminal 331 through the first resistor R1. The first positive input terminal 351b is connected to the first output terminal 351c through the second resistor R2. The first output terminal 351c is also connected to the third negative terminal 353b through the third resistor R3. The first negative input terminal 351a is also connected to the first positive input terminal 351b through the first capacitor C1. The second positive input terminal 352a is connected to the second signal terminal 332 through the fourth resistor R4. The second negative output terminal 352b is connected to the second output terminal 352c through the fifth resistor R5. The second output terminal 352c is connected to the third positive input terminal 353a through the sixth resistor R6. The second positive input terminal 352a is connected to the second negative terminal 352b through the second capacitor C2. The third positive input terminal 353a is grounded through the seventh resistor R7. The third negative input terminal 353a is connected to the third output terminal 353c through the eighth resistor R8. The first positive input terminal 351b is also connected to the second negative input terminal 352b through a rheostat R9. The first negative input 351a is grounded through the third capacitor C3. The second positive input terminal 352a is grounded through the fourth capacitor C4.

The first, second, third operational amplifiers 351, 352, 353 respectively include a voltage input terminal and a voltage output terminal. The voltage input terminal is connected to a direct current power supply VCC. The voltage output terminal is grounded. In one non-limiting example, the resistance of the first resistor R1 is equal to that of the fourth resistor R4. The resistance of the second resistor R2 is equal to that of the fifth resistor R5. The resistance of the third resistor R3 is equal to that of the sixth resistor R6. The resistance of the seventh resistor R7 is equal to that of the eighth resistor R8. The capacitance of the first capacitor C1 is equal to that of the second capacitor C2. The capacitance of the third capacitor C3 is equal to that of the fourth capacitor C4.

In one embodiment, the resistances of the first resistor to the eighth resistor R1-R8 respectively can be about 1KΩ, 20KΩ, 1KΩ, 1KΩ, 20KΩ, 1KΩ, 51KΩ, 51KΩ. The capacitances of the first capacitor to the fourth capacitor C1-C4 respectively can be about 100 pF, 100 pF, 0.1 uF, 0.1 uF. The voltage of VCC can be about 10V.

The third output terminals 353c of the four amplifying circuits 35 respectively output an A/D1 signal, an A/D2 signal, an A/D3 signal, and an A/D4 signal.

Figure 4:
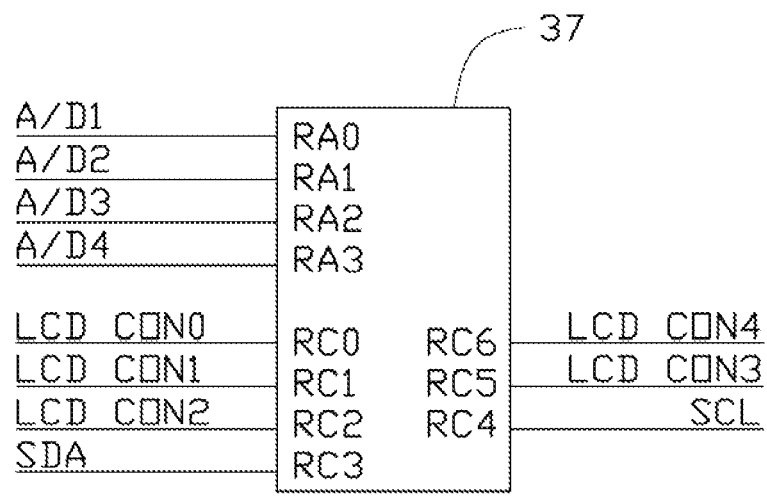
FIG. 4 is one embodiment of a microcontroller of the server rack of FIG. 1.

Referring to FIG. 4, the microcontroller 37 is electrically connected to the four amplifying circuits 35 and the display 50, and used for adding the output signals of the four amplifying circuits 35 to obtain the total weight of the main body 10 and the blade servers 200. The microcontroller 37 includes an RA0 terminal, an RA1 terminal, an RA2 terminal, an RA3 terminal, an RC0 terminal, an RC1 terminal, an RC2 terminal, an RC3 terminal, an RC4 terminal, an RC5 terminal, and an RC6 terminal. The RA0-RA3 terminals are analog to digital (A/D) conversion terminals, and electrically connected to the third output terminals 353c of the four amplifying circuits 35. The RC0-RC6 terminals are input/output terminals, and electrically connected to the display 50.

Figure 5:
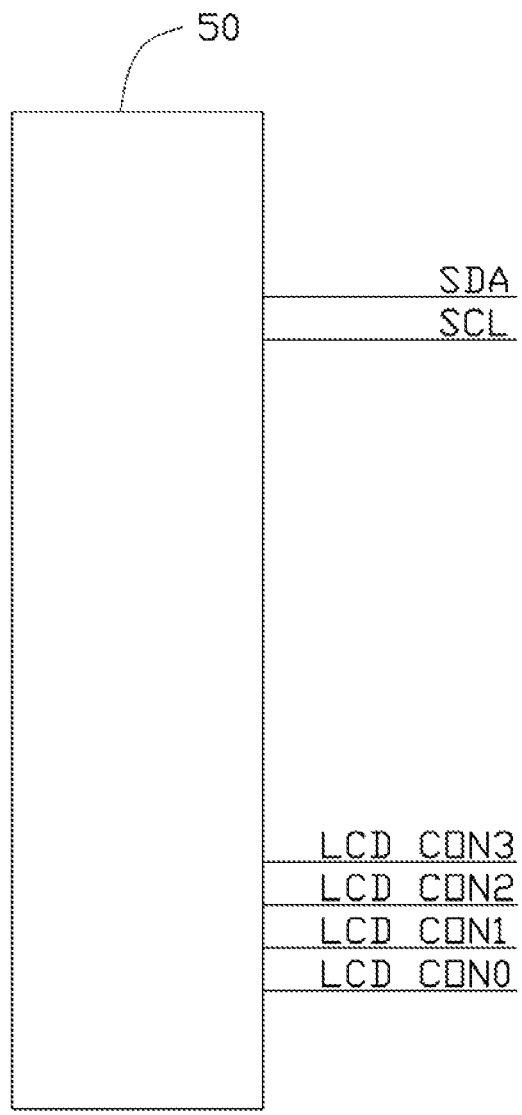
FIG. 5 is one embodiment of a display of the server rack of FIG. 1.

Referring to FIG. 5, the display 50 is positioned on the sidewall of the main body 10, and is used for displaying the weight calculated by the microcontroller 37. In this embodiment, the display 50 is a crystal display, and includes an LCD CON0 terminal, an LCD CON1 terminal, an LCD CON2 terminal, an LCD CON3 terminal, an LCD CON4 terminal, an SDA terminal, and an SDL terminal. The LCD CON1-LCD CON4 terminals are input/output terminals. The LCD CON0-LCD CON2 terminals are respectively electrically connected to the RC0-RC2 terminals of the microcontroller 37. The LCD CON3 terminal and the LCD CON4 terminal are electrically connected to the RC5 terminal and the RC6 terminal of the microcontroller 37. The SDA terminal is a serial data terminal. The SCL terminal is a serial clock terminal. The SDA terminal and SDL terminal are electrically connected to the RC3 terminal and the RC4 terminal of the microcontroller 37.

Referring to FIG. 2, the alarm 70 is positioned on the sidewall of the main body 10, and electrically connected to the microcontroller 37. The alarm 70 includes a memory 71, a comparison unit 72, and a buzzer 73. A predetermined weight threshold is stored in the memory 71 and represents the total weight of the main body 10 and the maximum blade servers that the main body 10 can bear. The comparison unit 72 is used for comparing the calculated weight with the predetermined weight threshold. The buzzer 73 is used for alerting users when the calculated weight is larger than the predetermined weight threshold.

In other embodiments, the number of the supporting feet 11 can be other than four according to practical need. In yet other embodiments, the supporting feet 11 can be omitted, and the pressure sensors 33 positioned directly under the main body 10. The number of the pressure sensors 33 can be varied according to number and placement of supporting feet.

It should be noted that in any embodiments, the weight of the supporting feet 11 can be tared before use.

It will be understood that the above particular disclosures and methods are shown and described by way of illustration only. The principles and the features of the present disclosure may be employed in various and numerous disclosures thereof without departing from the scope of the disclosure as claimed. The above-described disclosures illustrate the scope of the disclosure but do not restrict the scope of the disclosure.

What is claimed is:

1. A server rack, comprising:
a main body configured for receiving a plurality of blade servers therein;
an electronic scale comprising:
a pressure sensor supporting the main body and configured for measuring pressure from the main body to obtain a pressure signal,
a microcontroller configured for analyzing the pressure signal to calculate total weight of the main body and the blade servers, and
an amplifying circuit electrically connected to the pressure sensor and the microcontroller, and configured for amplifying the pressure signal of the pressure sensor, and sending the amplified pressure signal to the microcontroller, wherein the amplifying circuit comprises a first operational amplifier, a second operational amplifier, a third operational amplifier, a first capacitor, and a second capacitor; the first operational amplifier comprises a first positive input terminal, a first negative input terminal, and a first output terminal; the second operational amplifier comprises a second positive input terminal, a second negative input terminal, and a second output terminal; the third operational amplifier comprises a third positive input terminal, a third negative input terminal, and a third output terminal, the first positive input terminal is connected to the first signal terminal, the first negative input terminal is connected to the first output terminal, the first output terminal is also connected to the third negative input terminal, the first positive terminal is also connected to the first negative input terminal through the first capacitor, the second positive input terminal is connected to the second signal terminal of the pressure sensor, the second negative output terminal is connected to the second output terminal, the second output terminal is connected to the third positive output terminal, the second positive input terminal is connected to the second negative input terminal through the second capacitor, the third positive input terminal is grounded, the third negative input terminal is connected to the third output terminal, the first negative input terminal is also connected to the second negative input terminal;
an alarm storing a predetermined weight threshold, the predetermined weight threshold being total weight of the main body and a maximum number of blade servers that the main body can bear, the alarm signaling an alarm when the measured total weight is larger than the predetermined weight threshold.

2. The server rack in claim 1, wherein the capacitance of the first capacitor is equal to that of the second capacitor.

3. The server rack in claim 1, wherein the amplifying circuit further comprises a first resistor, a second resistor, a third resistor, a fourth resistor, a fifth resistor, a sixth resistor, a seventh resistor, and an eighth resistor, the first resistor is connected between the first negative input terminal and the first signal terminal, the second resistor is connected between first positive input terminal and the first output terminal, the third resistor is connected between first output terminal and the third negative terminal, the fourth resistor is connected between the second positive input terminal and the second signal terminal, the fifth resistor is connected between the second negative input terminal and the second output terminal, the sixth resistor and the seventh resistor are connected in series between the second output terminal and the ground, the eighth resistor is connected between the third negative input terminal and the third output terminal.

4. The server rack in claim 3, wherein the resistance of the first resistor is equal to that of the fourth resistor, the resistance of the second resistor is equal to that of the fifth resistor, the resistance of the third resistor is equal to that of the sixth resistor, the resistance of the seventh resistor is equal to that of the eighth resistor.

5. The server rack in claim 1, wherein the amplifying circuit further comprises a third capacitor and a fourth capacitor, the first positive terminal is grounded through the third capacitor, the second positive terminal is grounded through the fourth capacitor.

6. The server rack in claim 5, wherein the capacitance of the third capacitor is equal to that of the fourth capacitor.

7. The server rack in claim 1, wherein the amplifying circuit further comprises a rheostat connected between the first positive input terminal and the second negative input terminal.

8. The server rack in claim 1, wherein the alarm comprises a memory, a comparison unit, and a buzzer, a predetermined weight threshold is stored in the memory, the comparison unit is configured for comparing the total weight of the main body and the blade server with the weight threshold, the buzzer is configured for signaling the alarm when the measured total weight is larger than the predetermined weight threshold.

9. The server rack in claim 1, further comprising a display configured for displaying the measured weight value calculated by the microcontroller.

10. The server rack in claim 1, wherein when the number of the pressure sensor is more than one, the microcontroller is also configured for adding the pressure signals measured by the more than one pressure sensor, to obtain the total weight of the main body and the more than one blade servers.

11. The server rack in claim 10, wherein more than one supporting feet are positioned on a bottom surface of the main body and press on a corresponding pressure sensor.

\* \* \* \* \*